(12) United States Patent
Yoneda et al.

(10) Patent No.: US 11,437,969 B2
(45) Date of Patent: Sep. 6, 2022

(54) COUPLING LOOP CIRCUIT, NOISE FILTER CIRCUIT, AND CIRCUIT GENERATION METHOD

(71) Applicant: MITSUBISHI ELECTRIC CORPORATION, Tokyo (JP)

(72) Inventors: Satoshi Yoneda, Tokyo (JP); Kenji Hirose, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/206,965

(22) Filed: Mar. 19, 2021

(65) Prior Publication Data

US 2021/0211113 A1 Jul. 8, 2021

Related U.S. Application Data

(63) Continuation of application No. PCT/JP2018/043557, filed on Nov. 27, 2018.

(51) Int. Cl.
| | |
|---|---|
| *H03H 7/01* | (2006.01) |
| *H03H 7/09* | (2006.01) |
| *H03H 3/00* | (2006.01) |
| *H03H 1/00* | (2006.01) |

(52) U.S. Cl.
CPC ............ *H03H 7/0115* (2013.01); *H03H 3/00* (2013.01); *H03H 7/0138* (2013.01); *H03H 7/09* (2013.01); *H03H 2001/0085* (2013.01)

(58) Field of Classification Search
CPC ...... H01F 2017/0026; H01F 2017/006; H03H 2001/0085; H03H 7/09
USPC .......................................... 333/175, 177, 185
See application file for complete search history.

(56) References Cited

U.S. PATENT DOCUMENTS 10,181,375 B1 * 1/2019 Vann ......................... H01F 5/00

FOREIGN PATENT DOCUMENTS

| JP | 2007-305860 A | 11/2007 |
| JP | 2013-77663 A | 4/2013 |

* cited by examiner

*Primary Examiner* — Rakesh B Patel
(74) *Attorney, Agent, or Firm* — Birch, Stewart, Kolasch & Birch, LLP

(57) ABSTRACT

A coupling loop circuit is constructed in such a way that a sixth conductor is made to three-dimensionally cross a second conductor, an eighth conductor is made to three-dimensionally cross each of the second conductor and a fourth conductor, a first loop area and a second loop area spatially overlap each other, and an overlapping area between the first loop area and the second loop area is formed by the second conductor, the fourth conductor, the sixth conductor, and the eighth conductor.

8 Claims, 14 Drawing Sheets

First Plane

Second Plane

First Plane

Second Plane

First Plane

Second Plane

First Plane

Second Plane

COUPLING LOOP CIRCUIT, NOISE FILTER CIRCUIT, AND CIRCUIT GENERATION METHOD

CROSS REFERENCE TO RELATED APPLICATIONS

This application is a Continuation of PCT International Application No. PCT/JP2018/043557, filed on Nov. 27, 2018, which is hereby expressly incorporated by reference into the present application.

TECHNICAL FIELD

The present disclosure relates to a coupling loop circuit including multiple conductors, and a noise filter circuit including multiple conductors.

The present disclosure also relates to a circuit generation method of wiring conductor lines on a board.

BACKGROUND ART

In Patent Literature 1 below, a circuit module that ensures high isolation in a wide frequency band is disclosed.

The circuit module disclosed in Patent Literature 1 includes a first connecting line connected to a first element, a second connecting line connected to a second element, and a ground line connecting a connection point between the first connecting line and the second connecting line to a ground via a bypass capacitor.

Further, a first inductor is connected in series to the first connecting line, and a second inductor is connected in series to the second connecting line.

The first inductor and the second inductor are arranged in such a way that electromagnetic field coupling occurs between the inductors, and the mutual inductance caused by the electromagnetic field coupling cancels out the inductance parasitic in the bypass capacitor (referred to as the "parasitic inductance" hereafter).

CITATION LIST

Patent Literature

Patent Literature 1: JP 2013-077663 A

SUMMARY OF INVENTION

Technical Problem

In the circuit module disclosed in Patent Literature 1, the first inductor and the second inductor are layered in mutually different layers in a board, and the first inductor and the second inductor spatially overlap each other. In the case in which there is no positional deviation in the spatial overlap between the first inductor and the second inductor, the parasitic inductance is canceled out by the mutual inductance caused by the electromagnetic field coupling.

However, a problem is that in the case in which a positional deviation occurs in the spatial overlap between the first inductor and the second inductor, the parasitic inductance is not canceled out by the mutual inductance caused by the electromagnetic field coupling.

The present disclosure is made in order to solve the above-mentioned problem, and it is therefore an object of the present disclosure to provide a coupling loop circuit and a noise filter circuit that can cancel parasitic inductance even though a positional deviation occurs in a spatial overlap between a first loop area formed by first through fourth conductors and a second loop area formed by fifth through eighth conductors.

It is another object of the present disclosure to provide a circuit generation method of generating a circuit that can cancel the parasitic inductance even though a positional deviation occurs in the spatial overlap between the first loop area and the second loop area.

Solution to Problem

According to the present disclosure, there is provided a coupling loop circuit including: first through fourth conductors that are wired in a loop shape in order that a first loop area is formed; and fifth through eighth conductors that are wired in a loop shape in order that a second loop area is formed, wherein a first end of the first conductor and a first end of the second conductor are connected, a second end of the second conductor and a first end of the third conductor are connected, a second end of the third conductor and a first end of the fourth conductor are connected, a second end of the fourth conductor and a first end of the fifth conductor are connected, a second end of the fifth conductor and a first end of the sixth conductor are connected, a second end of the sixth conductor and a first end of the seventh conductor are connected, a second end of the seventh conductor and a first end of the eighth conductor are connected, the sixth conductor is made to three-dimensionally cross the second conductor, the eighth conductor is made to three-dimensionally cross each of the second conductor and the fourth conductor, the first loop area and the second loop area spatially overlap each other, and an overlapping area between the first loop area and the second loop area is formed by the second conductor, the fourth conductor, the sixth conductor, and the eighth conductor.

Advantageous Effects of Invention

According to the present disclosure, the coupling loop circuit is constructed in such a way that the sixth conductor is made to three-dimensionally cross the second conductor, the eighth conductor is made to three-dimensionally cross: the second conductor and the fourth conductor, the first loop area and the second loop area spatially overlap each other, and the overlapping area between the first loop area and the second loop area is formed by the second conductor, the fourth conductor, the sixth conductor, and the eighth conductor. Therefore, the coupling loop circuit according to the present disclosure can cancel parasitic inductance even though a positional deviation occurs in the spatial overlap between the first loop area and the second loop area.

DESCRIPTION OF EMBODIMENTS

Hereafter, in order to explain the present disclosure in greater detail, embodiments of the present disclosure will be described with reference to the accompanying drawings.

Embodiment 1

Figure 1:
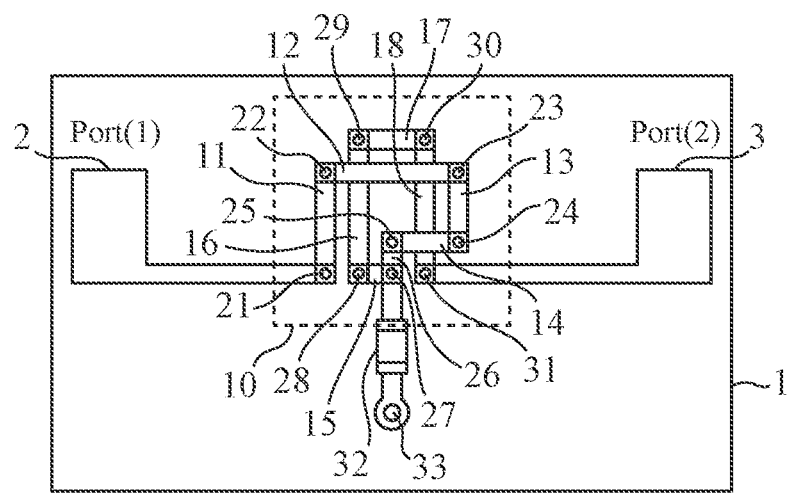
FIG. 1 is a schematic diagram showing a noise filter circuit according to Embodiment 1.

FIG. 1 is a schematic diagram showing a noise filter circuit according to Embodiment 1.

Figure 2:
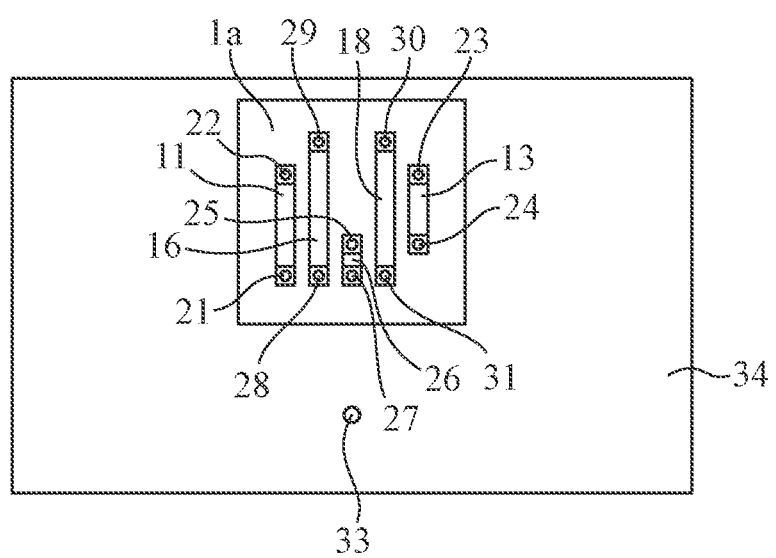
FIG. 2 is a plane view showing a first plane 1a in a board 1 on which the noise filter circuit according to Embodiment 1 is formed.
Figure 3:
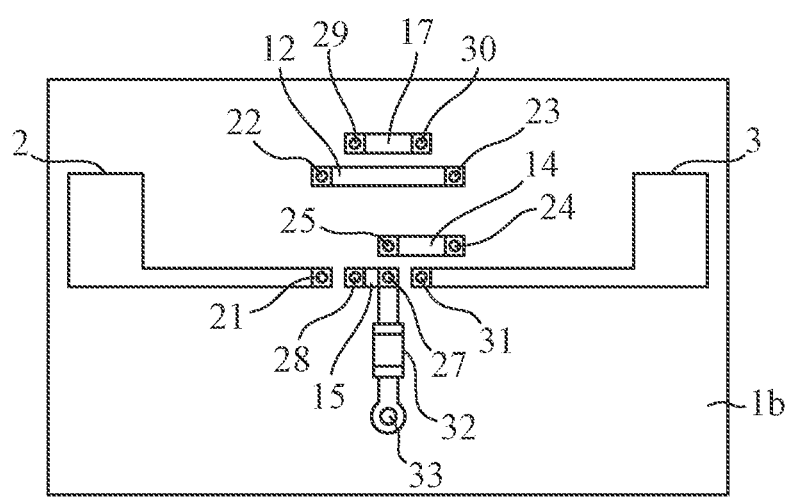
FIG. 3 is a plane view showing a second plane 1b in the board 1 on which the noise filter circuit according to Embodiment 1 is formed.

FIG. 2 is a plane view showing a first plane 1a in a board 1 on which the noise filter circuit according to Embodiment 1 is formed, and FIG. 3 is a plane view showing a second plane 1b in the board 1 on which the noise filter circuit according to Embodiment 1 is formed.

Figure 4A:
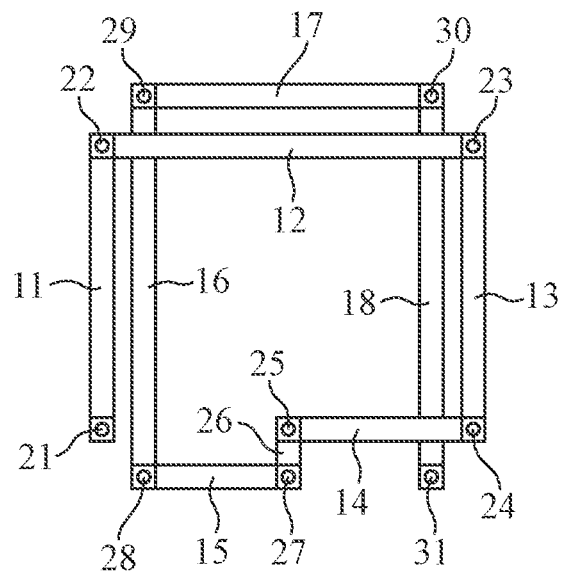
FIG. 4A is a schematic diagram showing a coupling loop circuit 10 according to Embodiment 1.

FIG. 4A is a schematic diagram showing a coupling loop circuit 10 according to Embodiment 1.

Figure 4B:
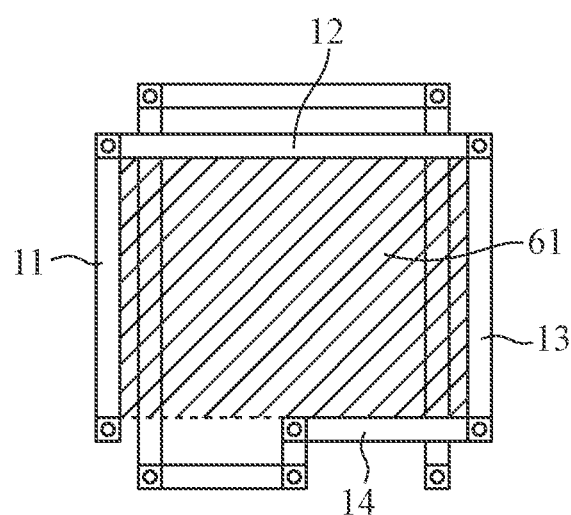
FIG. 4B is an explanatory drawing showing a first loop area 61 formed by a first conductor 11, a second conductor 12, a third conductor 13, and a fourth conductor 14.

FIG. 4B is an explanatory drawing showing a first loop area 61 formed by a first conductor 11, a second conductor 12, a third conductor 13, and a fourth conductor 14.

Figure 4C:
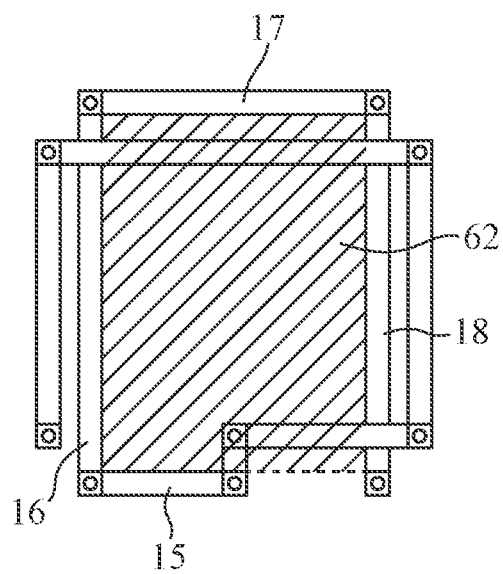
FIG. 4C is an explanatory drawing showing a second loop area 62 formed by a fifth conductor 15, a sixth conductor 16, a seventh conductor 17, and an eighth conductor 18.

FIG. 4C is an explanatory drawing showing a second loop area 62 formed by a fifth conductor 15, a sixth conductor 16, a seventh conductor 17, and an eighth conductor 18.

Figure 4D:
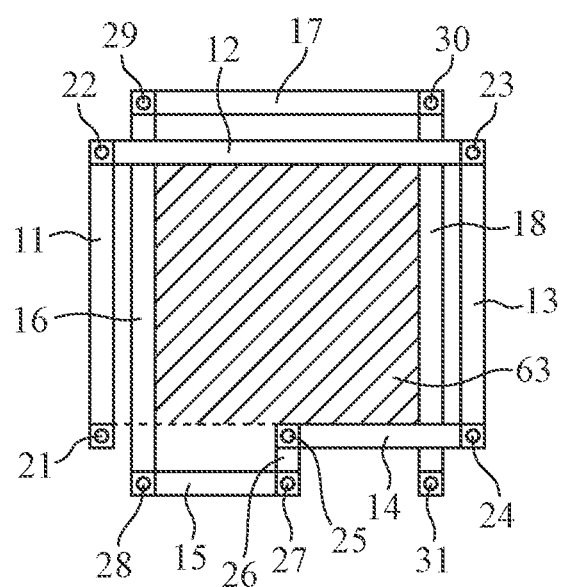
FIG. 4D is an explanatory drawing showing a spatial overlapping area 63 between the first loop area 61 and the second loop area 62.

FIG. 4D is an explanatory drawing showing a spatial overlapping area 63 between the first loop area 61 and the second loop area 62.

Figure 5:
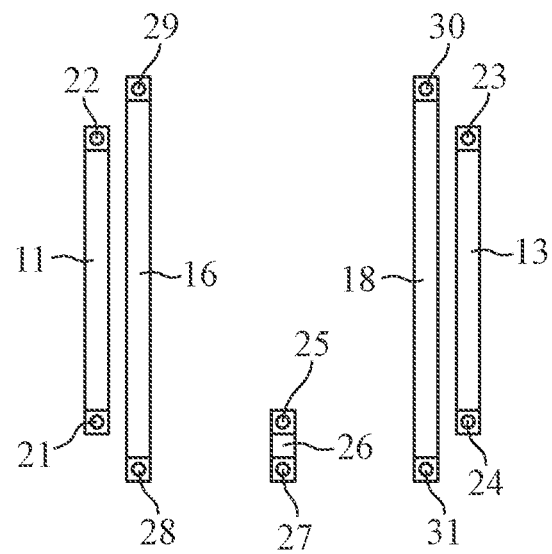
FIG. 5 is an explanatory drawing showing conductors formed on the first plane 1a in the board 1, out of multiple conductors in the coupling loop circuit 10 according to Embodiment 1.

FIG. 5 is an explanatory drawing showing conductors formed on the first plane 1a in the board 1, out of the multiple conductors in the coupling loop circuit 10 according to Embodiment 1.

Figure 6:
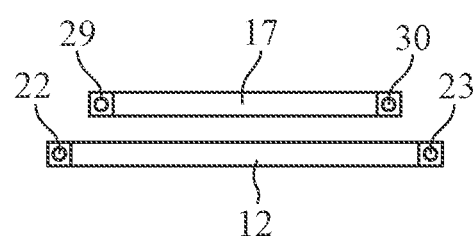
FIG. 6 is an explanatory drawing showing conductors formed on the second plane 1b in the board 1, out of the multiple conductors in the coupling loop circuit 10 according to Embodiment 1.
Figure 6:
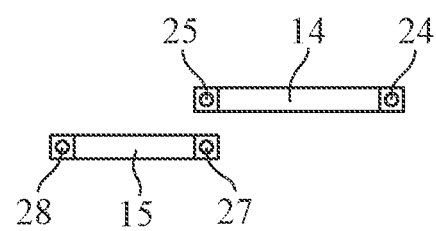

FIG. 6 is an explanatory drawing showing conductors formed on the second plane 1b in the board 1, out of the multiple conductors in the coupling loop circuit 10 according to Embodiment 1.

FIG. 1 is illustrated assuming that when the second plane 1b in the board 1 is viewed, the conductors and so on formed on the first plane 1a can be viewed.

FIG. 1 is a drawing showing the structure of the noise filter circuit, and because this drawing does not correctly show the length and the width of each of the conductors included in the noise filter circuit, the length and the width of each of the conductors are slightly different from those of each of the conductors shown in FIG. 4.

In FIGS. 1 to 6, the board 1 has the first plane 1a and the second plane 1b.

The first plane 1a is the rear surface of the board 1, and the second plane 1b is the front surface of the board 1.

However, this is only an example, and the first plane 1a may be the front surface of the board 1 and the second plane 1b may be the rear surface of the board 1.

An input/output terminal 2 is a terminal for inputting and outputting a high frequency signal. In FIG. 1, the input/output terminal 2 is expressed by Port (1).

An input/output terminal 3 is a terminal for inputting and outputting a high frequency signal. In FIG. 1, the input/output terminal 3 is expressed by Port (2).

In the noise filter circuit shown in FIG. 1, for example, the input/output terminal 2 is used as a terminal for inputting a high frequency signal, and the input/output terminal 3 is used as a terminal for outputting a high frequency signal.

The noise filter circuit shown in FIG. 1 includes the coupling loop circuit 10, and the coupling loop circuit 10 includes a first conductor line and a second conductor line.

The first conductor line includes the first conductor 11, the second conductor 12, the third conductor 13, and the fourth conductor 14. The first conductor 11, the second conductor 12, the third conductor 13, and the fourth conductor 14 are wired in a loop shape, and form the first loop area 61. The first loop area 61 is an area hatched in FIG. 4B.

The second conductor line includes the fifth conductor 15, the sixth conductor 16, the seventh conductor 17, and the eighth conductor 18. The fifth conductor 15, the sixth conductor 16, the seventh conductor 17, and the eighth conductor 18 are wired in a loop shape, and form the second loop area 62. The second loop area 62 is an area hatched in FIG. 4C.

The first loop area 61 and the second loop area 62 spatially overlap each other.

The spatial overlapping area 63 between the first loop area 61 and the second loop area 62 is an area hatched in FIG. 4D.

The first conductor 11 is arranged on the first plane 1a. One end of the first conductor 11 is connected to one end of the second conductor 12 via a via 22, and the other end of the first conductor 11 is connected to the input/output terminal 2 via a via 21.

The second conductor 12 is arranged on the second plane 1b. The one end of the second conductor 12 is connected to the one end of the first conductor 11 via the via 22, and the other end of the second conductor 12 is connected to one end of the third conductor 13 via a via 23.

The third conductor 13 is arranged on the first plane 1a. The one end of the third conductor 13 is connected to the other end of the second conductor 12 via the via 23, and the other end of the third conductor 13 is connected to one end of the fourth conductor 14 via a via 24.

The fourth conductor 14 is arranged on the second plane 1b. The one end of the fourth conductor 14 is connected to the other end of the third conductor 13 via the via 24, and the other end of the fourth conductor 14 is connected to one end of a conductor 26 via a via 25.

The fifth conductor 15 is arranged on the second plane 1b. One end of the fifth conductor 15 is connected to the other end of the conductor 26 via a via 27, and the other end of the fifth conductor 15 is connected to one end of the sixth conductor 16 via a via 28.

The sixth conductor 16 is arranged on the first plane 1a. The one end of the sixth conductor 16 is connected to the other end of the fifth conductor 15 via the via 28, and the other end of the sixth conductor 16 is connected to one end of the seventh conductor 17 via a via 29.

The sixth conductor 16 is arranged in such a way as to three-dimensionally cross the second conductor 12.

The seventh conductor 17 is arranged on the second plane 1b. The one end of the seventh conductor 17 is connected to the other end of the sixth conductor 16 via the via 29, and the other end of the seventh conductor 17 is connected to one end of the eighth conductor 18 via a via 30.

The eighth conductor 18 is arranged on the first plane 1a. The one end of the eighth conductor 18 is connected to the other end of the seventh conductor 17 via the via 30, and the other end of the eighth conductor 18 is connected to the input/output terminal 3 via a via 31.

The eighth conductor 18 is arranged in such a way as to three-dimensionally cross each of the second conductor 12 and the fourth conductor 14.

The via 21 is inserted into the board 1 in order to electrically connect the input/output terminal 2 and the other end of the first conductor 11.

The via 22 is inserted into the board 1 in order to electrically connect the one end of the first conductor 11 and the one end of the second conductor 12.

The via 23 is inserted into the board 1 in order to electrically connect the other end of the second conductor 12 and the one end of the third conductor 13.

The via 24 is inserted into the board 1 in order to electrically connect the other end of the third conductor 13 and the one end of the fourth conductor 14.

The via 25 is inserted into the board 1 in order to electrically connect the other end of the fourth conductor 14 and the one end of the conductor 26.

The conductor 26 is arranged on the first plane 1a. The one end of the conductor 26 is connected to the other end of the fourth conductor 14 via the via 25, and the other end of the conductor 26 is connected to the one end of the fifth conductor 15 via the via 27.

The via 27 is inserted into the board 1 in order to electrically connect the other end of the conductor 26 and the one end of the fifth conductor 15. The via 25, the conductor 26, and the via 27 are portions for connecting the first conductor line and the second conductor line.

In the noise filter circuit shown in FIGS. 1 to 3, the conductor 26 is arranged on the first plane 1a. However, this embodiment is not limited to this example, and the conductor 26 may be arranged on the second plane 1b.

In the case in which the conductor 26 is arranged on the second plane 1b, the one end of the conductor 26 is connected to the other end of the fourth conductor 14, and the other end of the conductor 26 is connected to the one end of the fifth conductor 15. In the case in which the conductor 26 is arranged on the second plane 1b, the vias 25 and 27 are unnecessary.

For example, in the case in which the shape of the fourth conductor 14 is L-shaped or the shape of the fifth conductor 15 is L-shaped, and the other end of the fourth conductor 14 and the one end of the fifth conductor 15 are connected directly, the conductor 26 is unnecessary.

The via 28 is inserted into the board 1 in order to electrically connect the other end of the fifth conductor 15 and the one end of the sixth conductor 16.

The via 29 is inserted into the board 1 in order to electrically connect the other end of the sixth conductor 16 and the one end of the seventh conductor 17.

The via 30 is inserted into the board 1 in order to electrically connect the other end of the seventh conductor 17 and the one end of the eighth conductor 18.

The via 31 is inserted into the board 1 in order to electrically connect the other end of the eighth conductor 18 and the input/output terminal 3.

A capacitor 32 is arranged on the second plane 1b. One end of the capacitor 32 connected to the via 27 which is a portion for connecting the first conductor line and the second conductor line, and the other end of the capacitor 32 is connected to a ground 34 via a via 33.

The via 33 is inserted into the board 1 in order to electrically connect the other end of the capacitor 32 and the ground 34.

The ground 34 is formed on the first plane 1a.

Figure 7:
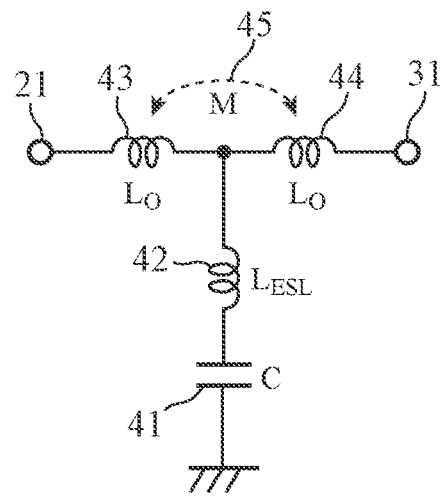
FIG. 7 is a circuit diagram showing the noise filter circuit shown in FIG. 1.

FIG. 7 is a circuit diagram showing the noise filter circuit shown in FIG. 1.

In FIG. 7, 41 denotes the capacitance C of the capacitor 32. 42 denotes the parasitic inductance $L_{ESL}$ of a ground path including the capacitor 32, and the parasitic inductance is the sum total of the inductance parasitic in the capacitor 32 and the inductance of the board 1.

43 denotes the inductance $L_0$ of the first conductor line, and 44 denotes the inductance $L_0$ of the second conductor line.

45 denotes the mutual inductance M caused by the electromagnetic field coupling between the first conductor line and the second conductor line.

Figure 8:
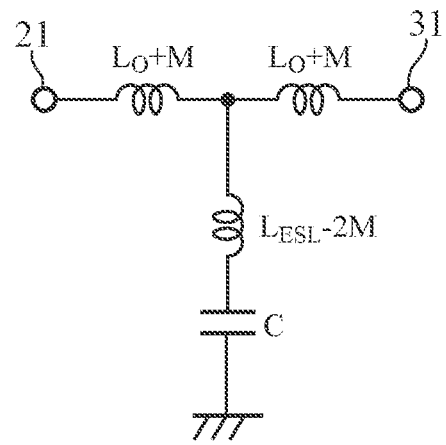
FIG. 8 is a circuit diagram showing a result of performing an equivalent circuit transformation on the noise filter circuit shown in FIG. 7.

FIG. 8 is a circuit diagram showing a result of performing an equivalent circuit transformation on the noise filter circuit shown in FIG. 7.

Next, the operation of the noise filter circuit shown in FIG. 1 will be explained.

If the parasitic inductance 42 is close to zero, the noise filter circuit shown in FIG. 1 can efficiently remove high frequency noise even though the noise filter circuit does not include the coupling loop circuit 10.

However, because the actual parasitic inductance 42 is not zero, the noise filter circuit shown in FIG. 1 cancels the parasitic inductance 42 by including the coupling loop circuit 10.

Concretely, the mutual inductance M caused by the electromagnetic field coupling between the first conductor line and the second conductor line cancels out the parasitic inductance 42.

The mutual inductance M is determined by the amount of flux linkage Φ which is the amount of magnetic flux linking with the second conductor line, the magnetic flux being caused by the flow of a current through the first conductor line.

The amount of flux linkage Φ increases with increase in the size $B_z$ of the spatial overlapping area 63 between the first conductor line and the second conductor line, and remains constant if the size $B_z$ of the overlapping area 63 does not change.

Therefore, the mutual inductance M also remains constant if the size $B_z$ of the overlapping area 63 does not change.

Figure 9:
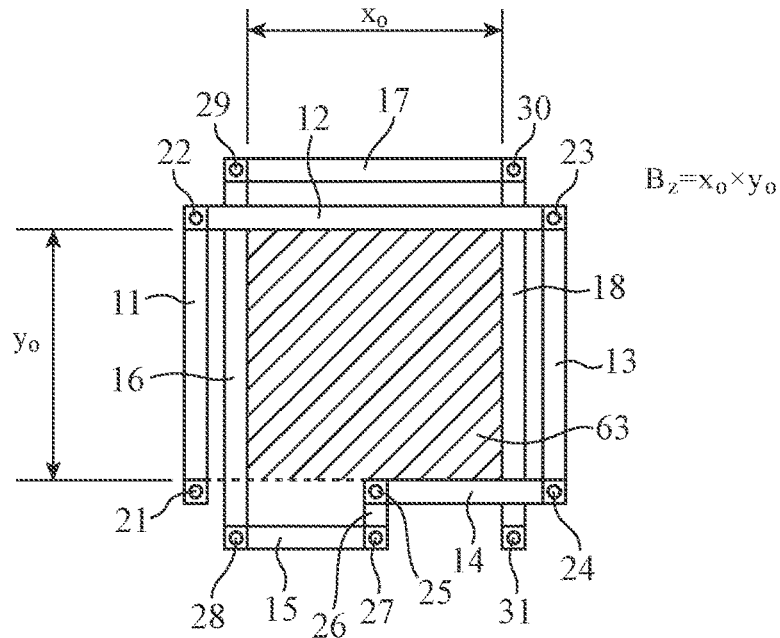
FIG. 9 is an explanatory drawing showing the size $B_z$ of the spatial overlapping area 63 between the first loop area 61 and the second loop area 62.

FIG. 9 is an explanatory drawing showing the size $B_z$ of the spatial overlapping area 63 between the first loop area 61 and the second loop area 62. In FIG. 9, a hatched area shows the spatial overlapping area 63.

The size $B_z$ of the overlapping area 63 is expressed by $B_z = x_0 \times y_0$. In the example of FIG. 9, $x_0 = y_0$. However, this is only an example, and the following relation may be established: $x_0 \neq y_0$.

Figure 10:
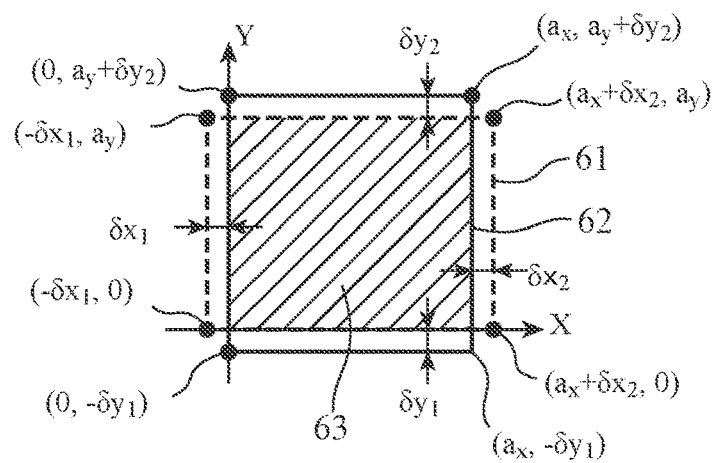
FIG. 10 is an explanatory drawing showing the position of the first loop area 61 and the position of the second loop area 62.

FIG. 10 is an explanatory drawing showing the position of the first loop area 61 and the position of the second loop area 62.

In FIG. 10, the X axis is parallel to each of the second conductor 12, the fourth conductor 14, the fifth conductor 15, and the seventh conductor 17. The Y axis is parallel to each of the first conductor 11, the third conductor 13, the sixth conductor 16, and the eighth conductor 18.

Figure 11:
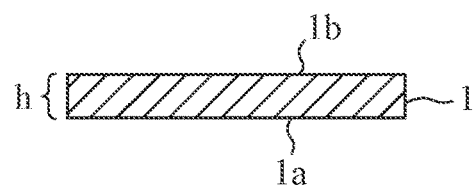
FIG. 11 is a side view showing the board 1 on which the noise filter circuit according to Embodiment 1 is formed.

FIG. 11 is a side view showing the board 1 on which the noise filter circuit according to Embodiment 1 is formed. The board 1 shown in FIG. 11 has a thickness of h.

The mutual inductance M is expressed by the following equation (1).

$$M = \frac{\mu}{4\pi} \sum_{i,j} \left[ 2\left\{ \sqrt{h^2 + (a_x + \delta x_i)^2 + (a_y + \delta y_j)^2} + \sqrt{h^2 + \delta x_i^2 + \delta y_j^2} - \sqrt{h^2 + (a_x + \delta x_i)^2 + \delta y_j^2} - \sqrt{h^2 + \delta x_i^2 + (a_y + \delta y_j)^2} \right\} + (a_x + \delta x_i)\left\{ \tanh^{-1} \frac{(a_x + \delta x_i)}{\sqrt{h^2 + (a_x + \delta x_i)^2 + \delta y_j^2}} - \tanh^{-1} \frac{(a_x + \delta x_i)}{\sqrt{h^2 + (a_x + \delta x_i)^2 + (a_y + \delta y_j)^2}} \right\} + (a_y + \delta y_j)\left\{ \tanh^{-1} \frac{(a_y + \delta y_j)}{\sqrt{h^2 + \delta x_i^2 + (a_y + \delta y_j)^2}} - \tanh^{-1} \frac{(a_y + \delta y_j)}{\sqrt{h^2 + (a_x + \delta x_i)^2 + (a_y + \delta y_j)^2}} \right\} + \delta x_i \left\{ \tanh^{-1} \frac{\delta x_i}{\sqrt{h^2 + \delta x_i^2 + (a_y + \delta y_j)^2}} - \tanh^{-1} \frac{\delta x_i}{\sqrt{h^2 + \delta x_i^2 + \delta y_j^2}} \right\} + \delta y_j \left\{ \tanh^{-1} \frac{\delta y_j}{\sqrt{h^2 + (a_x + \delta x_i)^2 + \delta y_j^2}} - \tanh^{-1} \frac{\delta y_j}{\sqrt{h^2 + \delta x_i^2 + \delta y_j^2}} \right\} \right]$$

In the equation (1), i=1, 2, and j=1, 2. $a_x$ denotes the length in a direction of the X axis of the overlapping area 63, and $a_y$ denotes the length in a direction of the Y axis of the overlapping area 63.

$\delta x_1$ denotes the length of the first loop area 61's portion protruding, in a negative direction of the X axis, with respect to the second loop area 62, and $\delta x_2$ denotes the length of the first loop area 61's portion protruding, in a positive direction of the X axis, with respect to the second loop area 62.

$\delta y_1$ denotes the length of the second loop area 62's portion protruding, in a negative direction of the Y axis, with respect to the first loop area 61, and $\delta y_2$ denotes the length of the second loop area 62's portion protruding, in a positive direction of the Y axis, with respect to the first loop area 61.

μ denotes the magnetic permeability between the first loop area 61 and the second loop area 62.

Figure 12:
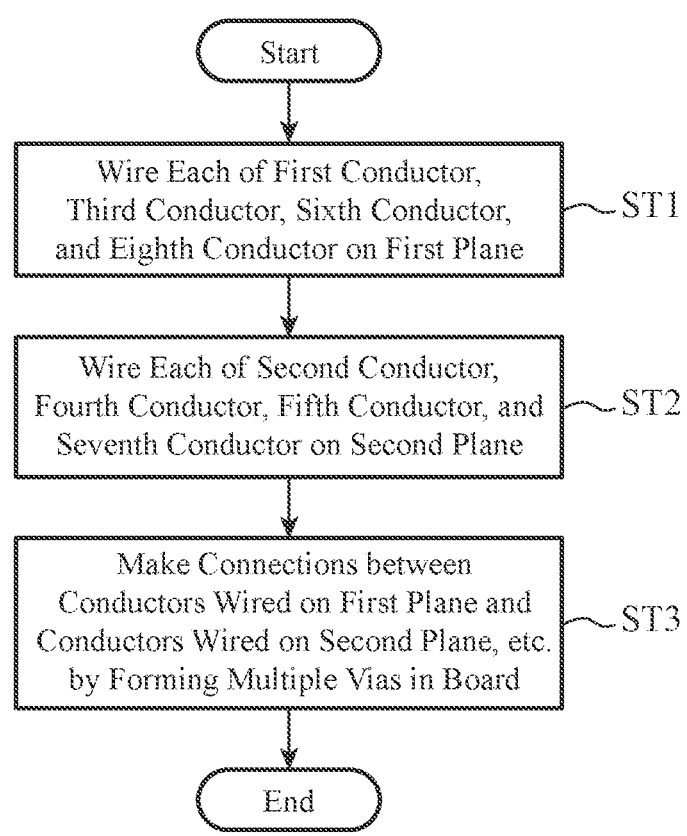
FIG. 12 is a flowchart showing a circuit generation method according to Embodiment 1.

Here, a method of generating the coupling loop circuit 10 is shown by steps ST1 to ST3, as shown in FIG. 12, and the coupling loop circuit 10 is generated by performing steps ST1 to ST3.

FIG. 12 is a flowchart showing the circuit generation method according to Embodiment 1.

Hereafter, the details of steps ST1 to ST3 will be explained concretely.

Step ST1

In the circuit generation method shown in FIG. 12, each of the first conductor 11 and the third conductor 13 is wired, as a conductor included in the first conductor line, on the first plane 1a of the board 1, and the conductor 26 is wired on the first plane 1a.

Further, in the circuit generation method shown in FIG. 12, each of the sixth conductor 16 and the eighth conductor 18 is wired, as a conductor included in the second conductor line, on the first plane 1a.

Step ST2

In the circuit generation method shown in FIG. 12, each of the second conductor 12 and the fourth conductor 14 is wired, as a conductor included in the first conductor line, on the second plane 1b of the board 1.

Further, in the circuit generation method shown in FIG. 12, each of the fifth conductor 15 and the seventh conductor 17 is wired, as a conductor included in the second conductor line, on the second plane 1b.

Step ST3

In the circuit generation method shown in FIG. 12, by forming multiple vias in the board 1, a connection between each of the conductors wired on the first plane 1a and each of the conductors wired on the second plane 1b, or the like is made.

Concretely, connections are made as follows.

(a) By forming the via 21 in the board 1, the input/output terminal 2 and the other end of the first conductor 11 are connected.

(b) By forming the via 22 in the board 1, the one end of the first conductor 11 and the one end of the second conductor 12 are connected.

(c) By forming the via 23 in the board 1, the other end of the second conductor 12 and the one end of the third conductor 13 are connected.

(d) By forming the via 24 in the board 1, the other end of the third conductor 13 and the one end of the fourth conductor 14 are connected.

(e) By forming the via 25 in the board 1, the other end of the fourth conductor 14 and the one end of the conductor 26 are connected.

(f) By forming the via 27 in the board 1, the other end of the conductor 26 and the one end of the fifth conductor 15 are connected.

(g) By forming the via 28 in the board 1, the other end of the fifth conductor 15 and the one end of the sixth conductor 16 are connected.

(h) By forming the via 29 in the board 1, the other end of the sixth conductor 16 and the one end of the seventh conductor 17 are connected.

(i) By forming the via 30 in the board 1, the other end of the seventh conductor 17 and the one end of the eighth conductor 18 are connected.

(j) By forming the via 31 in the board 1, the other end of the eighth conductor 18 and the input/output terminal 3 are connected.

In the circuit generation method shown in FIG. 12, in step ST1, each of the first conductor 11, the third conductor 13, the sixth conductor 16, the eighth conductor 18, and the conductor 26 is wired on the first plane 1a. After that, in step ST2, each of the second conductor 12, the fourth conductor 14, the fifth conductor 15, and the seventh conductor 17 is wired on the second plane 1b.

Therefore, for example, there is a case in which even though the position of each of the conductors wired on the first plane 1a matches a desired position which is, for example, a designed position, the position of each of the conductors wired on the second plane 1b deviates from a desired position.

In the case in which the position of each of the conductors wired on the second plane 1b deviates from the desired position, the position of the first loop area 61 may deviate from the position of the first loop area 61 (referred to as "the correct position of the first loop area 61" hereafter) in the case in which the position matches the desired position. Further, in the case in which the position of each of the conductors wired on the second plane 1b deviates from the desired position, the position of the second loop area 62 may deviate from the position of the second loop area 62 (referred to as "the correct position of the second loop area 62" hereafter) in the case in which the position matches the desired position.

Conversely, there is a case in which even though the position of each of the conductors wired on the second plane 1b matches the desired position, the position of each of the conductors wired on the first plane 1a deviates from the desired position.

In the case in which the position of each of the conductors wired on the first plane 1a deviates from the desired position, the position of the first loop area 61 may deviate from the correct position of the first loop area 61. Further, in the case in which the position of each of the conductors wired on the first plane 1a deviates from the desired position, the position of the second loop area 62 may deviate from the correct position of the second loop area 62.

Figure 13A:
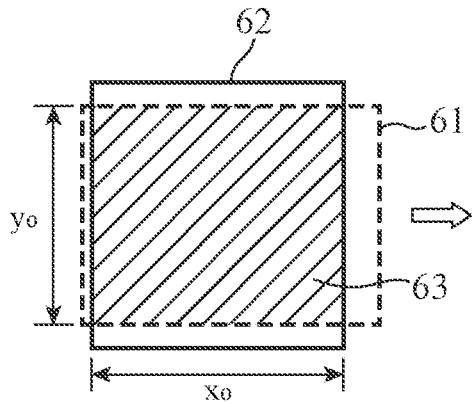
FIG. 13A is an explanatory drawing showing a state in which the first loop area 61 deviates toward a direction shown by an arrow (in the figure, toward a rightward direction) with respect to the second loop area 62.
Figure 13B:
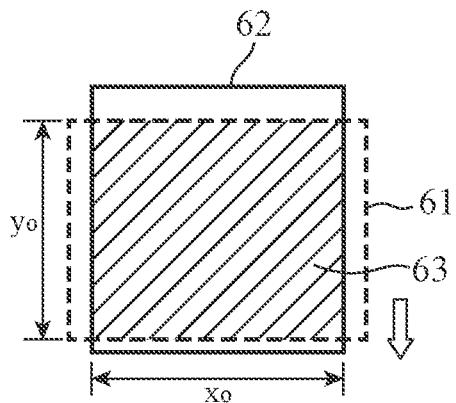
FIG. 13B is an explanatory drawing showing a state in which the first loop area 61 deviates toward a direction shown by an arrow (in the figure, toward a downward direction) with respect to the second loop area 62.
Figure 13C:
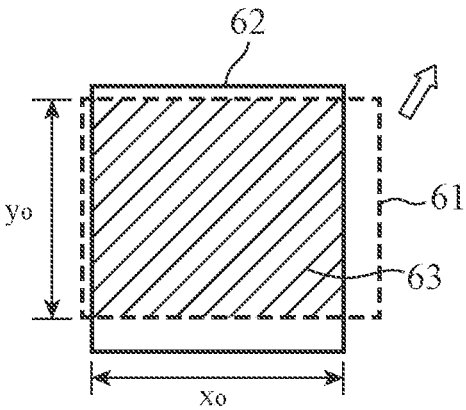
FIG. 13C is an explanatory drawing showing a state in which the first loop area 61 deviates toward a direction shown by an arrow (in the figure, toward a right upward direction) with respect to the second loop area 62.

FIGS. 13A to 13C are explanatory drawings each showing an example of the spatial positional deviation between the first loop area 61 and the second loop area 62.

FIG. 13A shows a state in which the first loop area 61 deviates, toward a direction shown by an arrow (in the figure, toward a rightward direction), with respect to the second loop area 62.

FIG. 13B shows a state in which the first loop area 61 deviates, toward a direction shown by an arrow (in the figure, toward a downward direction), with respect to the second loop area 62.

FIG. 13C shows a state in which the first loop area 61 deviates, toward a direction shown by an arrow (in the figure, toward a right upward direction), with respect to the second loop area 62.

However, in the circuit generation method shown in FIG. 12, in step ST1, when wiring the sixth conductor 16 on the first plane 1a, the sixth conductor 16 is made to three-dimensionally cross the second conductor 12 (this crossing is referred to as the "first three-dimensionally crossing" hereafter).

Further, in step ST1, when wiring the eighth conductor 18 on the first plane 1a, the eighth conductor 18 is made to three-dimensionally cross each of the second conductor 12 and the fourth conductor 14 (this crossing is referred to as the "second three-dimensionally crossing" hereafter).

Therefore, even though the first loop area 61 deviates, toward a direction shown by an arrow, with respect to the second loop area 62, the size of the overlapping area 63 does not change as long as the deviation falls within a range within which the first and second three-dimensionally crossings can be formed.

The size $B_z = x_0 \times y_0$ of the overlapping area 63 shown in FIGS. 13A to 13C is the same as the size $B_z = x_0 \times y_0$ of the overlapping area 63 shown in FIG. 9.

As long as the size $B_z$ of the overlapping area 63 does not change, the mutual inductance M caused by the electromagnetic field coupling between the first conductor line and the second conductor line does not change.

In the case in which the first conductor line and the second conductor line are arranged at positions at which the electromagnetic field coupling occurs, the mutual inductance M caused by the electromagnetic field coupling is added to each of the inductance $L_0$ of the first conductor line and the inductance $L_0$ of the second conductor line, as shown in FIG. 8.

Further, the parasitic inductance 42 of the ground path including the capacitor 32 is equal to the result of subtracting double the mutual inductance M from the parasitic inductance $L_{ESL}$.

Therefore, if the mutual inductance M is designed in such a way that double the mutual inductance M becomes equal to the parasitic inductance $L_{ESL}$, the parasitic inductance $L_{ESL}$ can be cancelled.

The noise filter circuit shown in FIG. 1 has the first conductor line and the second conductor line which are adapted in such a way that double the mutual inductance M becomes equal to the parasitic inductance $L_{ESL}$.

In the first conductor line and the second conductor line, the length $\alpha_x$ in a direction of the X axis of the overlapping area 63, the length $\alpha_y$ in a direction of the Y axis of the overlapping area 63, the thickness h of the board 1, and the magnetic permeability $\mu$ are designed in such a way that double the mutual inductance M becomes equal to the parasitic inductance $L_{ESL}$.

Figure 14:
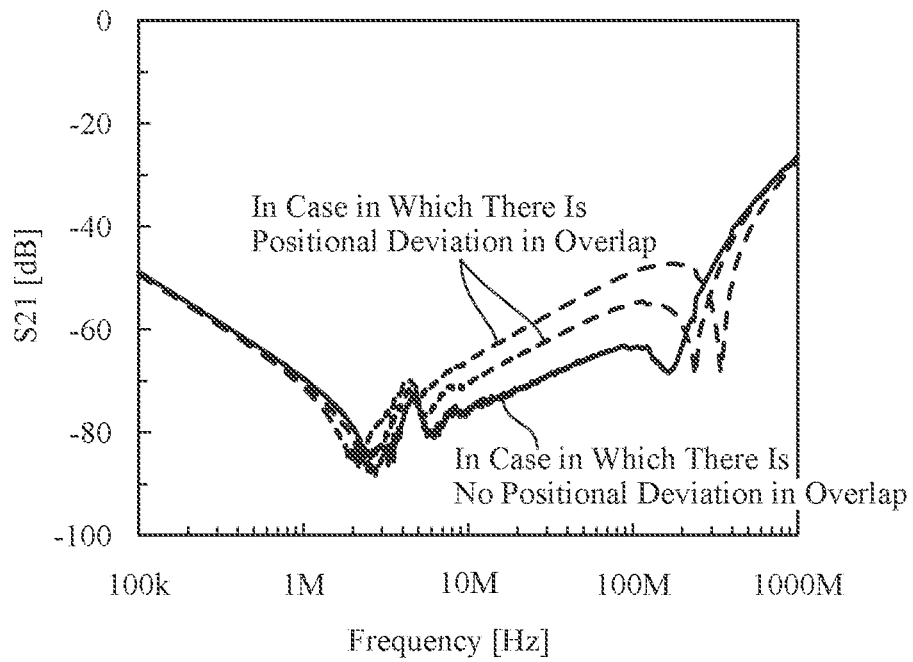
FIG. 14 is an explanatory drawing showing results of simulation of the transmission property of a high frequency signal in a circuit module disclosed by Patent Literature 1, in the case in which there is a positional deviation in a spatial overlap between a first inductor and a second inductor, and in the case in which there is no positional deviation in the overlap.

FIG. 14 is an explanatory drawing showing results of simulation of the transmission property of a high frequency signal in the circuit module disclosed in Patent Literature 1, in the case in which there is a positional deviation in a spatial overlap between a first inductor and a second inductor, and in the case in which there is no positional deviation in the overlap.

Figure 15:
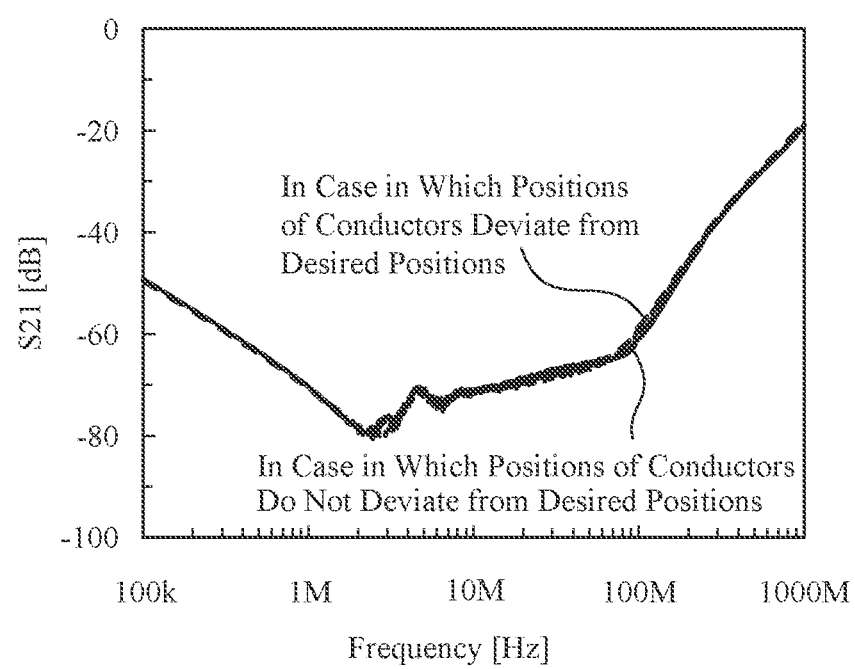
FIG. 15 is an explanatory drawing showing results of simulation of the transmission property of a high frequency signal in the noise filter circuit shown in FIG. 1, in the case in which the position of each conductor in the first plane 1a or the second plane 1b deviates from a desired position, and in the case in which the position of each conductor does not deviate from the desired position.

FIG. 15 is an explanatory drawing showing results of simulation of the transmission property of a high frequency signal in the noise filter circuit shown in FIG. 1, in the case in which the position of each of the conductors on the first plane 1a or the second plane 1b deviates from the desired position, and in the case in which the position of each of the conductors does not deviate from the desired position.

In FIGS. 14 and 15, the vertical axis shows an S-parameter S21 which is one of S-parameters, and the horizontal axis shows the frequency of a high frequency signal inputted to the circuit module or the noise filter circuit.

Figure 16:
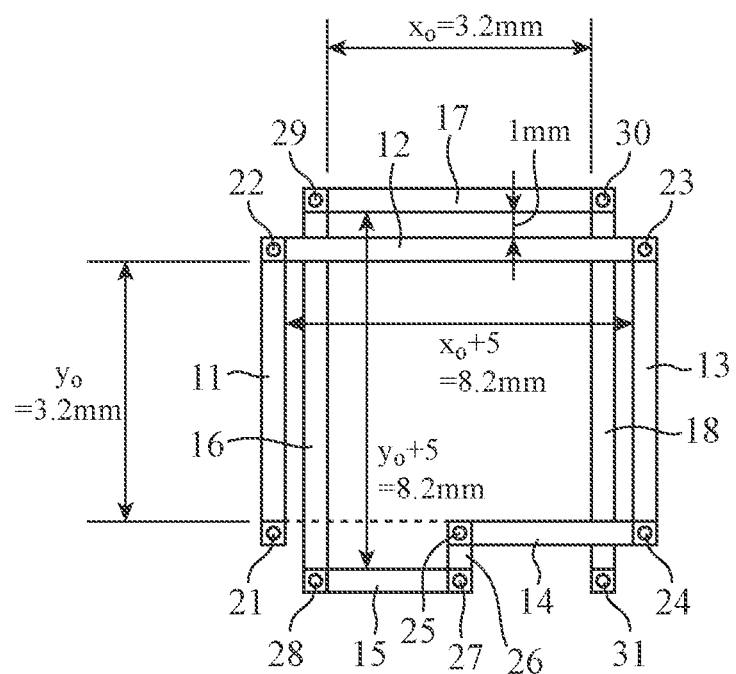
FIG. 16 is an explanatory drawing showing the spacing between conductors arranged on the same plane, and so on as a condition for the simulation of the transmission property of a high frequency signal.

FIG. 16 is an explanatory drawing showing the spacing between conductors arranged on the same plane, and so on, as conditions for the simulation of the transmission property of a high frequency signal.

The spacing between the second conductor 12 and the fourth conductor 14 is $y_0=3.2$ mm.

The spacing between the second conductor 12 and the seventh conductor 17 is 1 mm, and the spacing between the fifth conductor 15 and the seventh conductor 17 is $y_0+5=8.2$ mm.

The spacing between the sixth conductor 16 and the eighth conductor 18 is $x_0=3.2$ mm.

The spacing between the first conductor 11 and the third conductor 13 is $x_0+5=8.2$ mm.

In the circuit module disclosed in Patent Literature 1, the transmission property of a high frequency signal in the case in which there is a positional deviation in the spatial overlap between the first inductor and the second inductor differs from the transmission property of a high frequency signal in the case in which there is no positional deviation in the spatial overlap, as shown in FIG. 14.

Thus, in the circuit module, the mutual inductance in the case in which there is a positional deviation in the spatial overlap between the first inductor and the second inductor differs from the mutual inductance in the case in which there is no positional deviation in the spatial overlap.

In the noise filter circuit shown in FIG. 1, the transmission property of a high frequency signal in the case in which the position of each of the conductors on the first plane 1a or the second plane 1b deviates from the desired position approximately matches the transmission property of a high frequency signal in the case in which the position of each of the conductors does not deviate from the desired position, as shown in FIG. 15.

Therefore, in the noise filter circuit shown in FIG. 1, the mutual inductance M in the case in which the position of each of the conductors deviates from the desired position is approximately equal to the mutual inductance M in the case in which the position of each of the conductors does not deviate from the desired position.

In above-mentioned Embodiment 1, the coupling loop circuit 10 is constructed in such a way that the sixth conductor 16 is made to three-dimensionally cross the second conductor 12, the eighth conductor 18 is made to three-dimensionally cross each of the second conductor 12 and the fourth conductor 14, the first loop area 61 and the second loop area 62 spatially overlap each other, and the overlapping area 63 between the first loop area 61 and the second loop area 62 is formed by the second conductor 12, the fourth conductor 14, the sixth conductor 16, and the eighth conductor 18. Therefore, in the coupling loop circuit 10, even though a positional deviation occurs in the spatial overlap between the first loop area 61 and the second loop area 62, the parasitic inductance $L_{ESL}$ of the ground path including the capacitor 32 can be cancelled.

In the coupling loop circuit 10 shown in FIG. 4, the shape of the first loop area 61 is rectangular and the shape of the second loop area 62 is rectangular.

However, this is only an example, and for example, the shape of the first loop area 61 may be parallelogrammatic and the shape of the second loop area 62 may be parallelogrammatic.

However, even in the case in which the shape of each of the first loop area 61 and the second loop area 62 is parallelogrammatic, each of the third conductor 13, the sixth conductor 16, and the eighth conductor 18 is arranged in parallel with the first conductor 11. Further, each of the fourth conductor 14, the fifth conductor 15, and the seventh conductor 17 is arranged in parallel with the second conductor 12.

Further, the sixth conductor 16 three-dimensionally crosses the second conductor 12, and the eighth conductor 18 three-dimensionally crosses each of the second conductor 12 and the fourth conductor 14.

In the coupling loop circuit 10 included in the noise filter circuit shown in FIGS. 1 to 3, each of the first conductor line and the second conductor line has conductors arranged on the first plane 1a and conductors arranged on the second plane 1b.

Concretely, each of the first conductor 11, the third conductor 13, the sixth conductor 16, and the eighth conductor 18 is arranged on the first plane 1a, and each of the second conductor 12, the fourth conductor 14, the fifth conductor 15, and the seventh conductor 17 is arranged on the second plane 1b.

However, this is only an example, and the coupling loop circuit 10 may be one in which the first conductor line has only the conductors arranged on the first plane 1a, and the second conductor line has only the conductors arranged on the second plane 1b.

Figure 17:
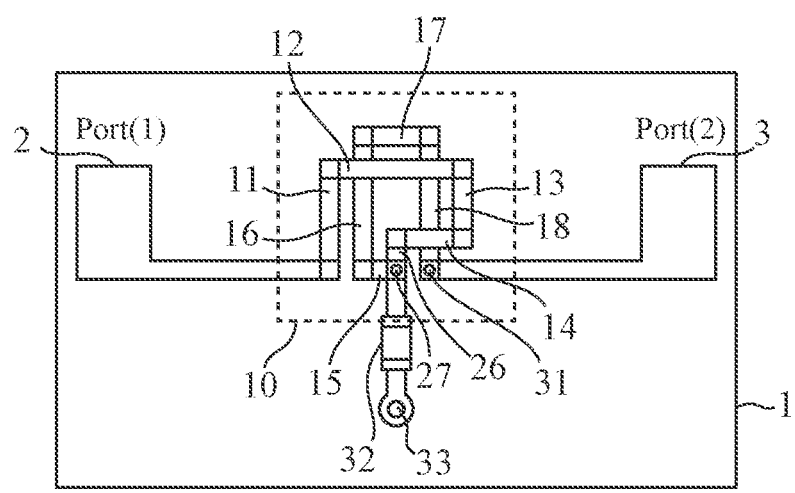
FIG. 17 is a schematic diagram showing anther noise filter circuit according to Embodiment 1.
Figure 18:
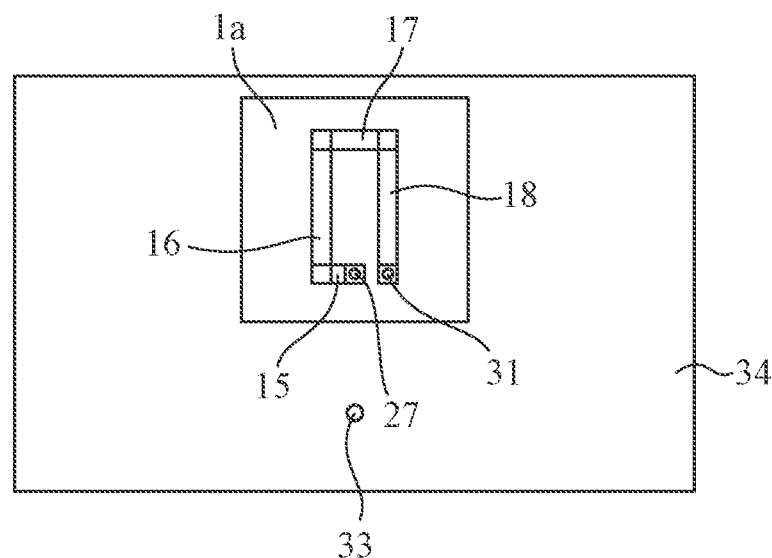
FIG. 18 is a plane view showing a first plane 1a in a board 1 on which the other noise filter circuit according to Embodiment 1 is formed.
Figure 19:
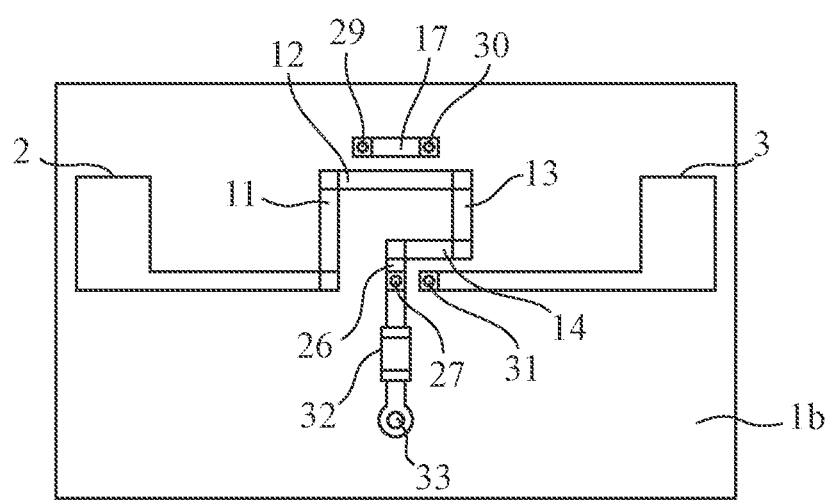
FIG. 19 is a plane view showing a second plane 1b in the board 1 on which the other noise filter circuit according to Embodiment 1 is formed.

Concretely, as shown in FIGS. 17 to 19, the coupling loop circuit 10 may be one in which each of the first conductor 11, the second conductor 12, the third conductor 13, and the fourth conductor 14 is arranged on the first plane 1a, and each of the fifth conductor 15, the sixth conductor 16, the seventh conductor 17, and the eighth conductor 18 is arranged on the second plane 1b. The conductor 26 is arranged on the second plane 1b, and the vias 21 to 25 and 28 to 30 are unnecessary.

FIG. 17 is a schematic diagram showing the other noise filter circuit according to Embodiment 1.

FIG. 18 is a plane view showing the first plane 1a in the board 1 on which the other noise filter circuit according to Embodiment 1 is formed, and FIG. 19 is a plane view showing the second plane 1b in the board 1 on which the other noise filter circuit according to Embodiment 1 is formed.

For example, in the case in which the shape of the fourth conductor 14 is L-shaped and the other end of the fourth conductor 14 is connected directly to the via 27, the conductor 26 is unnecessary.

Further, the coupling loop circuit 10 may be one in which the first conductor line has only the conductors arranged on the second plane 1b, and the second conductor line has only the conductors arranged on the first plane 1a.

Concretely, the coupling loop circuit 10 may be one in which each of the first conductor 11, the second conductor 12, the third conductor 13, and the fourth conductor 14 is arranged on the second plane 1b, and each of the fifth conductor 15, the sixth conductor 16, the seventh conductor 17, and the eighth conductor 18 is arranged on the first plane 1a.

Embodiment 2

The noise filter circuit of Embodiment 1 is of single end type.

In Embodiment 2, a noise filter circuit of differential type will be explained.

Figure 20:
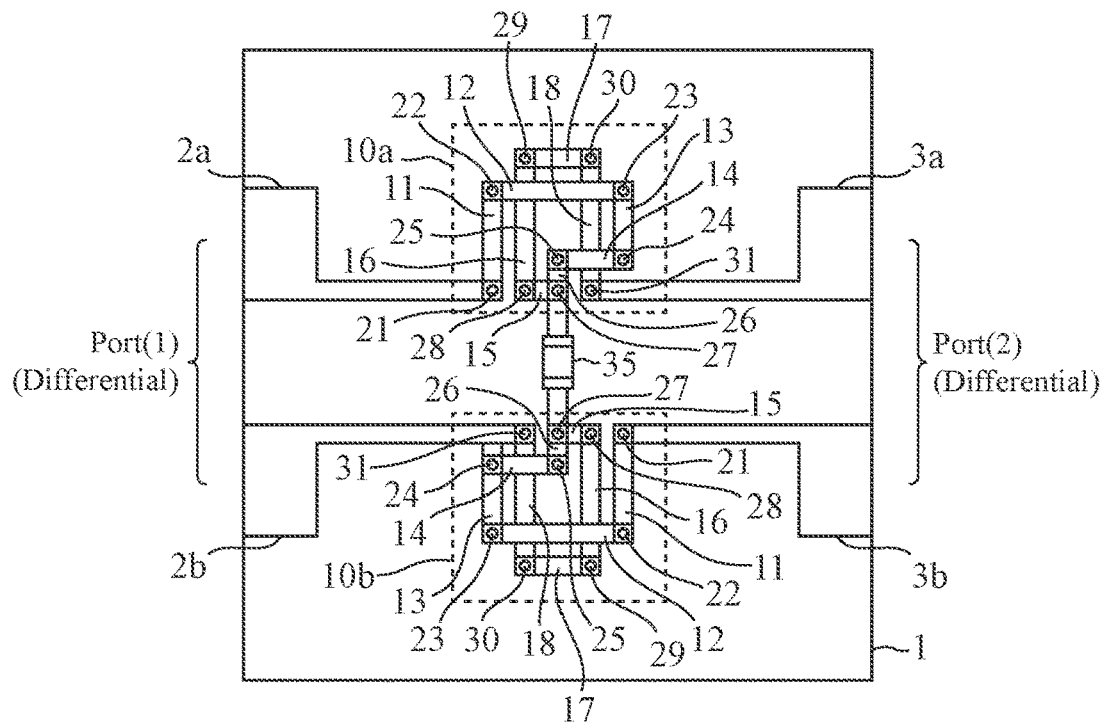
FIG. 20 is a schematic diagram showing a noise filter circuit according to Embodiment 2.

FIG. 20 is a schematic diagram showing the noise filter circuit according to Embodiment 2.

Figure 21:
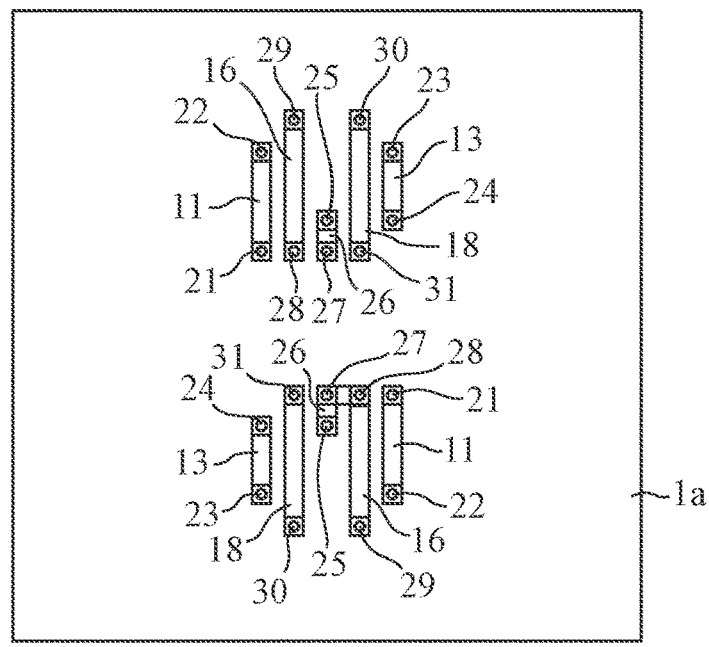
FIG. 21 is a plane view showing a first plane 1a in a board 1 on which the noise filter circuit according to Embodiment 2 is formed.
Figure 22:
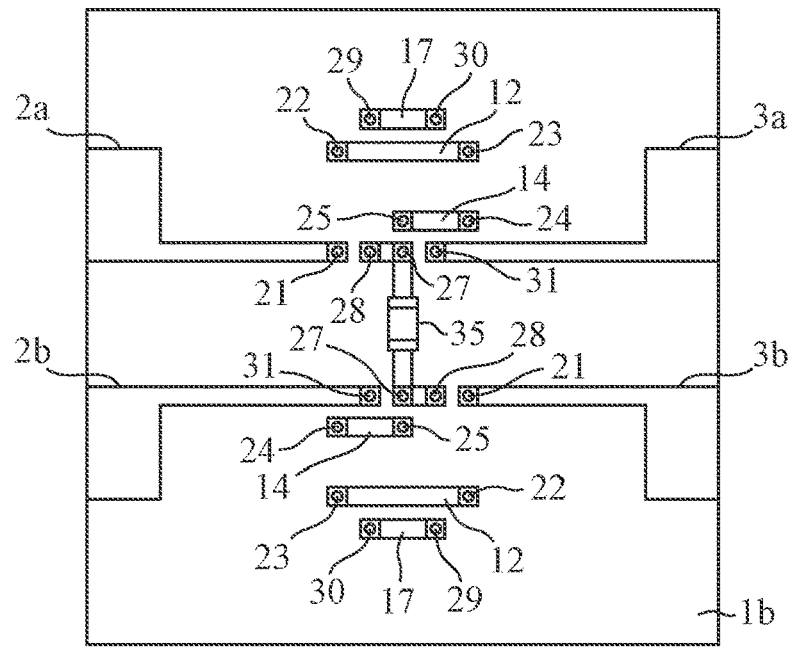
FIG. 22 is a plane view showing a second plane 1b in the board 1 on which the noise filter circuit according to Embodiment 2 is formed.

FIG. 21 is a plane view showing a first plane 1a in a board 1 on which the noise filter circuit according to Embodiment 2 is formed, and FIG. 22 is a plane view showing a second plane 1b in the board 1 on which the noise filter circuit according to Embodiment 2 is formed.

FIG. 20 is illustrated assuming that when the second plane 1b in the board 1 is viewed, conductors and so on formed on the first plane 1a can be viewed.

In FIGS. 20 to 22, because the same reference signs as those shown in FIGS. 1 to 3 denote the same components or like components, an explanation of the components will be omitted hereafter.

The noise filter circuit shown in FIG. 20 include a first coupling loop circuit 10a and a second coupling loop circuit 10b.

The structure of each of the first coupling loop circuit 10a and the second coupling loop circuit 10b is the same as that of the coupling loop circuit 10 shown in FIG. 4.

However, one end of a first conductor 11 included in the first coupling loop circuit 10a is connected to an input/output terminal 2a, and another end of an eighth conductor 18 included in the first coupling loop circuit is connected to an input/output terminal 3a.

One end of a first conductor 11 included in the second coupling loop circuit 10b is connected to an input/output terminal 3b, and an eighth conductor 18 included in the second coupling loop circuit 10b is connected to an input/output terminal 2b.

The input/output terminal 2a and the input/output terminal 2b are a pair of differential input/output ports, and are expressed by Port (1) in FIG. 20.

The input/output terminal 3a and the input/output terminal 3b are a pair of differential input/output ports, and are expressed by Port (2) in FIG. 20.

In the noise filter circuit shown in FIG. 20, in the second coupling loop circuit 10b, the first conductor 11 included in a first conductor line is connected to the input/output terminal 3b, and the eighth conductor 18 included an a second conductor line is connected to the input/output terminal 2b. However, this is only an example, and in the second coupling loop circuit 10b the first conductor 11 included in the first conductor line may be connected to the input/output terminal 2b, and the eighth conductor 18 included in the second conductor line may be connected to the input/output terminal 3b.

One end of a capacitor 35 is connected to one end of a fifth conductor 15 included in the first coupling loop circuit 10a, and the other end of the capacitor 35 is connected to one end of a fifth conductor 15 included in the second coupling loop circuit 10b.

In the first coupling loop circuit 10a, even though a positional deviation occurs between a first loop area 61 and a second loop area 62, the size $B_z$ of an overlapping area 63 does not change as long as the deviation falls within a range within which first and second three-dimensionally crossings can be formed, like in the coupling loop circuit 10 shown in FIG. 4.

Further, also in the second coupling loop circuit 10b, even though a positional deviation occurs between a first loop area 61 and a second loop area 62, the size $B_z$ of an overlapping area 63 does not change as long as the deviation falls within a range within which first and second three-dimensionally crossings can be formed.

Figure 23:
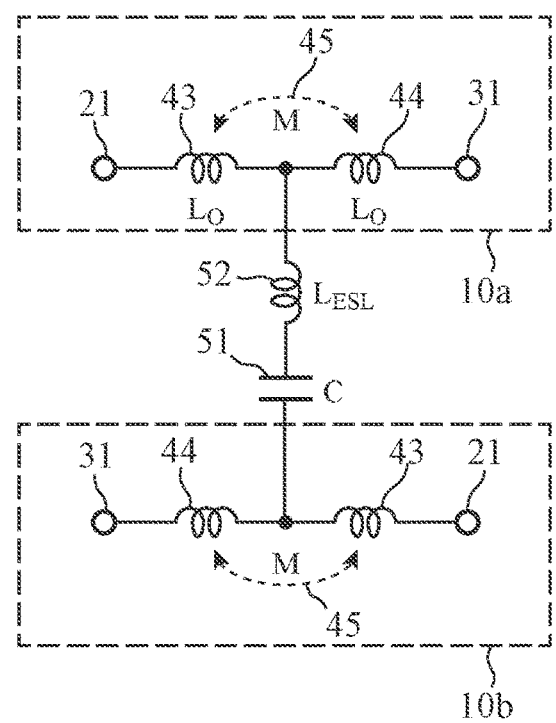
FIG. 23 is a circuit diagram showing the noise filter circuit shown in FIG. 20.

FIG. 23 is a circuit diagram showing the noise filter circuit shown in FIG. 20. In FIG. 23, because the same reference signs as those shown in FIGS. 7 and 20 denote the same components or like components, an explanation of the components will be omitted hereafter.

51 denotes the capacitance C of the capacitor 35.

52 denotes the parasitic inductance $L_{ESL}$ of a ground path including the capacitor 35, and the parasitic inductance is the sum total of the inductance parasitic in the capacitor 35 and the inductance of the board 1.

Figure 24:
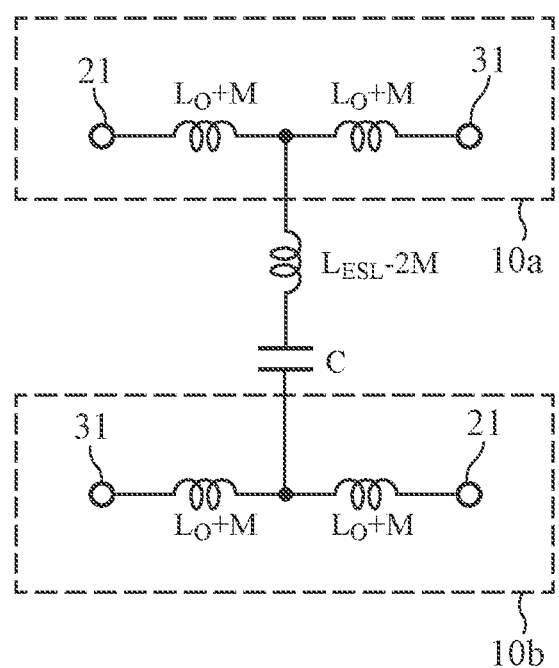
FIG. 24 is a circuit diagram showing a result of performing an equivalent circuit transformation on the noise filter circuit shown in FIG. 23.

FIG. 24 is a circuit diagram showing a result of performing an equivalent circuit transformation on the noise filter circuit shown in FIG. 23.

The first conductor line included in the first coupling loop circuit 10a and the second conductor line included in the first coupling loop circuit 10a are arranged at positions at which electromagnetic field coupling occurs. The mutual inductance M caused by the electromagnetic field coupling is added to each of the inductance $L_0$ of the first conductor line included in the first coupling loop circuit 10a and the inductance $L_0$ of the second conductor line included in the first coupling loop circuit 10a, as shown in FIG. 24.

The first conductor line included in the second coupling loop circuit 10b and the second conductor line included in the second coupling loop circuit 10b are arranged at positions at which electromagnetic field coupling occurs. The mutual inductance M caused by the electromagnetic field coupling is added to each of the inductance $L_0$ of the first conductor line included in the second coupling loop circuit 10b and the inductance $L_0$ of the second conductor line included in the second coupling loop circuit 10b, as shown in FIG. 24.

Further, the parasitic inductance 52 of the path including the capacitor 35 is equal to the result of subtracting double the mutual inductance M from the parasitic inductance $L_{ESL}$.

Therefore, if the mutual inductance M is designed in such a way that double the mutual inductance M becomes equal to the parasitic inductance $L_{ESL}$, the parasitic inductance $L_{ESL}$ can be cancelled.

Each of the first coupling loop circuit 10a and the second coupling loop circuit 10b in the noise filter circuit shown in FIG. 20 has the first conductor line and the second conductor line which are adapted in such a way that double the mutual inductance M becomes equal to the parasitic inductance $L_{ESL}$.

In the first conductor line and the second conductor line, the length $\alpha_x$ in a direction of the X axis of the overlapping area 63, the length $\alpha_y$ in a direction of the Y axis of the overlapping area 63, the thickness h of the board 1, and magnetic permeability $\mu$ are designed in such a way that double the mutual inductance M becomes equal to the parasitic inductance $L_{ESL}$.

In above-mentioned Embodiment 2, the noise filter circuit is constructed in such a way that in each of the first coupling loop circuit 10a and the second coupling loop circuit 10b, a sixth conductor 16 three-dimensionally crosses a second conductor 12, and the eighth conductor 18 three-dimensionally crosses each of the second conductor 12 and a fourth conductor 14. Therefore, the noise filter circuit can cancel the parasitic inductance $L_{ESL}$ of the path including the capacitor 35 even though a positional deviation occurs in the spatial overlap between the first loop area 61 and the second loop area 62.

It is to be understood that any combination of the above-mentioned embodiments can be made, various changes can be made in any component according to any one of the above-mentioned embodiments, or any component according to any one of the above-mentioned embodiments can be omitted within the scope of the present disclosure.

INDUSTRIAL APPLICABILITY

The present disclosure is suitable for a coupling loop circuit including multiple conductors and a noise filter circuit including multiple conductors.

Further, the present disclosure is suitable for a circuit generation method of wiring conductor lines on a board.

REFERENCE SIGNS LIST 1 board, 1a first plane, 1b second plane, 2, 2a, and 2b input/output terminal, 3, 3a, and 3b input/output terminal, 10 coupling loop circuit, 10a first coupling loop circuit, 10b second coupling loop circuit, 11 first conductor, 12 second conductor, 13 third conductor, 14 fourth conductor, 15 fifth conductor, 16 sixth conductor, 17 seventh conductor, 18 eighth conductor, 21 to 25 via, 26 conductor, 27 to 31, and 33 via, 32 capacitor, 34 ground, 35 capacitor, 41 and 51 capacitance, 42 and 52 parasitic inductance, 43 and 44 inductance, 45 mutual inductance, 61 first loop area, 62 second loop area, and 63 overlapping area.

The invention claimed is:

1. A coupling loop circuit comprising:
first through fourth conductors that are wired in a loop shape in order that a first loop area is formed; and
fifth through eighth conductors that are wired in a loop shape in order that a second loop area is formed,
wherein a first end of the first conductor and a first end of the second conductor are connected,
a second end of the second conductor and a first end of the third conductor are connected,
a second end of the third conductor and a first end of the fourth conductor are connected,
a second end of the fourth conductor and a first end of the fifth conductor are connected,
a second end of the fifth conductor and a first end of the sixth conductor are connected,
a second end of the sixth conductor and a first end of the seventh conductor are connected,
a second end of the seventh conductor and a first end of the eighth conductor are connected,
the sixth conductor is made to three-dimensionally cross the second conductor,
the eighth conductor is made to three-dimensionally cross each of the second conductor and the fourth conductor,
the first loop area and the second loop area spatially overlap each other, and
an overlapping area between the first loop area and the second loop area is formed by the second conductor, the fourth conductor, the sixth conductor, and the eighth conductor,
the first conductor is arranged on a first plane of a board,
the second conductor is arranged on a second plane of the board and the first end of the second conductor is connected to the first end of the first conductor via a via,
the third conductor is arranged on the first plane and the first end of the third conductor is connected to the second end of the second conductor via a via,
the fourth conductor is arranged on the second plane and the first end of the fourth conductor is connected to the second end of the third conductor via a via,
the fifth conductor is arranged on the second plane and the first end of the fifth conductor is connected to the second end of the fourth conductor,
the sixth conductor is arranged on the first plane and the first end of the sixth conductor is connected to the second end of the fifth conductor via a via,
the seventh conductor is arranged on the second plane and the first end of the seventh conductor is connected to the second end of the sixth conductor via a via,
and the eighth conductor is arranged on the first plane and the first end of the eighth conductor is connected to the second end of the seventh conductor via a via.

2. The coupling loop circuit according to claim 1, wherein the third conductor is arranged in parallel with the first conductor,
the fourth conductor is arranged in parallel with the second conductor,
the fifth conductor is arranged in parallel with the second conductor,
the sixth conductor is arranged in parallel with the first conductor,
the seventh conductor is arranged in parallel with the second conductor, and
the eighth conductor is arranged in parallel with the first conductor.

3. A noise filter circuit comprising:
a first conductor line including first through fourth conductors that are wired in a loop shape in order that a first loop area is formed;
a second conductor line including fifth through eighth conductors that are wired in a loop shape in order that a second loop area is formed; and a capacitor whose first end is connected to a connecting portion between the first conductor line and the second conductor line and whose second end is connected to a ground, wherein a first end of the first conductor and a first end of the second conductor are connected, a second end of the second conductor and a first end of the third conductor are connected, a second end of the third conductor and a first end of the fourth conductor are connected, a second end of the fourth conductor and a first end of the fifth conductor are connected, a second end of the fifth conductor and a first end of the sixth conductor are connected, a second end of the sixth conductor and a first end of the seventh conductor are connected, a second end of the seventh conductor and a first end of the eighth conductor are connected, the sixth conductor is made to three-dimensionally cross the second conductor, the eighth conductor is made to three-dimensionally cross each of the second conductor and the fourth conductor, the first loop area and the second loop area spatially overlap each other, and an overlapping area between the first loop area and the second loop area is formed by the second conductor, the fourth conductor, the sixth conductor, and the eighth conductor.

4. The noise filter circuit according to claim 3, further comprising:

a first coupling loop circuit having the first conductor line and the second conductor line; and a second coupling loop circuit having the first conductor line and the second conductor line, and wherein the first end of the capacitor is connected to the first end of the fifth conductor included in the first coupling loop circuit, and the second end of the capacitor is connected to, instead of the ground, the first end of the fifth conductor included in the second coupling loop circuit, the sixth conductor included in the first coupling loop circuit is made to three-dimensionally cross the second conductor included in the first coupling loop circuit, the eighth conductor included in the first coupling loop circuit is made to three-dimensionally cross each of the second conductor included in the first coupling loop circuit and the fourth conductor included in the first coupling loop circuit, the sixth conductor included in the second coupling loop circuit is made to three-dimensionally cross the second conductor included in the second coupling loop circuit, and the eighth conductor included in the second coupling loop circuit is made to three-dimensionally cross each of the second conductor included in the second coupling loop circuit and the fourth conductor included in the second coupling loop circuit.

5. A coupling loop circuit comprising:

first through fourth conductors that are wired in a loop shape in order that a first loop area is formed; and fifth through eighth conductors that are wired in a loop shape in order that a second loop area is formed, wherein a first end of the first conductor and a first end of the second conductor are connected, a second end of the second conductor and a first end of the third conductor are connected, a second end of the third conductor and a first end of the fourth conductor are connected, a second end of the fourth conductor and a first end of the fifth conductor are connected, a second end of the fifth conductor and a first end of the sixth conductor are connected, a second end of the sixth conductor and a first end of the seventh conductor are connected, a second end of the seventh conductor and a first end of the eighth conductor are connected, the sixth conductor is made to three-dimensionally cross the second conductor, the eighth conductor is made to three-dimensionally cross each of the second conductor and the fourth conductor, the first loop area and the second loop area spatially over lap each other, and an overlapping area between the first loop area and the second loop area is formed by the second conductor, the fourth conductor, the sixth conductor, and the eighth conductor, each of the first conductor, the second conductor, the third conductor, and the fourth conductor is arranged on a first plane of a board, each of the fifth conductor, the sixth conductor, the seventh conductor, and the eighth conductor is arranged on a second plane of the board, and the second end of the fourth conductor and the first end of the fifth conductor are connected via a via.

6. The coupling loop circuit according to claim 5, wherein the third conductor is arranged in parallel with the first conductor, the fourth conductor is arranged in parallel with the second conductor, the fifth conductor is arranged in parallel with the second conductor, the sixth conductor is arranged in parallel with the first conductor, the seventh conductor is arranged in parallel with the second conductor, and the eighth conductor is arranged in parallel with the first conductor.

7. A circuit generation method comprising:

wiring a first conductor line on a board, the first conductor line including first through fourth conductors that are wired in a loop shape, in order to form a first loop area;

wiring a second conductor line on the board, the second conductor line including fifth through eighth conductors that are wired in a loop shape, in order to form a second loop area;

connecting a first end of the first conductor and a first end of the second conductor;

connecting a second end of the second conductor and a first end of the third conductor;

connecting a second end of the third conductor and a first end of the fourth conductor;

connecting a second end of the fourth conductor and a first end of the fifth conductor;

connecting a second end of the fifth conductor and a first end of the sixth conductor;

connecting a second end of the sixth conductor and a first end of the seventh conductor;

connecting a second end of the seventh conductor and a first end of the eighth conductor;

when wiring each of the first conductor line and the second conductor line on the board, making the sixth conductor three-dimensionally cross the second conductor and making the eighth conductor three-dimensionally cross each of the second conductor and the fourth conductor in such a way that the first loop area and the second loop area spatially overlap each other;

forming an overlapping area between the first loop area and the second loop area with the second conductor, the fourth conductor, the sixth conductor, and the eighth conductor, arranging the first conductor on a first plane of a board, arranging the second conductor on a second plane of the board and connecting the first end of the second conductor to the first end of the first conductor via a via, arranging the third conductor on the first plane and connecting the first end of the third conductor to the second end of the second conductor via a via, arranging the fourth conductor on the second plane and connecting the first end of the fourth conductor to the second end of the third conductor via a via, arranging the fifth conductor on the second plane and connecting the first end of the fifth conductor to the second end of the fourth conductor, arranging the sixth conductor on the first plane and connecting the first end of the sixth conductor to the second end of the fifth conductor via a via, arranging the seventh conductor on the second plane and connecting the first end of the seventh conductor to the second end of the sixth conductor via a via, and arranging the eighth conductor on the first plane and connecting the first end of the eighth conductor to the second end of the seventh conductor via a via.

8. A circuit generation method comprising:

wiring a first conductor line on a board, the first conductor line including first through fourth conductors that are wired in a loop shape, in order to form a first loop area;

wiring a second conductor line on the board, the second conductor line including fifth through eighth conductors that are wired in a loop shape, in order to form a second loop area;

connecting a first end of the first conductor and a first end of the second conductor;

connecting a second end of the second conductor and a first end of the third conductor;

connecting a second end of the third conductor and a first end of the fourth conductor;

connecting a second end of the fourth conductor and a first end of the fifth conductor;

connecting a second end of the fifth conductor and a first end of the sixth conductor;

connecting a second end of the sixth conductor and a first end of the seventh conductor;

connecting a second end of the seventh conductor and a first end of the eighth conductor;

when wiring each of the first conductor line and the second conductor line on the board, making the sixth conductor three-dimensionally cross the second conductor and making the eighth conductor three-dimensionally cross each of the second conductor and the fourth conductor in such a way that the first loop area and the second loop area spatially overlap each other;

forming an overlapping area between the first loop area and the second loop area with the second conductor, the fourth conductor, the sixth conductor, and the eighth conductor, arranging each of the first conductor, the second conductor, the third conductor, and the fourth conductor on a first plane of a board, arranging each of the fifth conductor, the sixth conductor, the seventh conductor, and the eighth conductor on a second plane of the board, and connecting the second end of the fourth conductor and the first end of the fifth conductor via a via.

* * * * *